US010388654B2

(12) United States Patent
Holt et al.

(10) Patent No.: US 10,388,654 B2
(45) Date of Patent: Aug. 20, 2019

(54) METHODS OF FORMING A GATE-TO-SOURCE/DRAIN CONTACT STRUCTURE

(71) Applicant: GLOBALFOUNDRIES Inc., Grand Cayman (KY)

(72) Inventors: Judson R. Holt, Ballston Lake, NY (US); George Mulfinger, Wilton, NY (US); Timothy J. McArdle, Ballston Lake, NY (US); Thomas Merbeth, Dresden (DE); Ömür Aydin, Dresden (DE); Ruilong Xie, Niskayuna, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/868,058

(22) Filed: Jan. 11, 2018

(65) Prior Publication Data

US 2019/0214387 A1    Jul. 11, 2019

(51) Int. Cl.
*H01L 27/092* (2006.01)
*H01L 21/8238* (2006.01)
*H01L 27/11* (2006.01)
*H01L 29/66* (2006.01)
*H01L 21/8234* (2006.01)
*H01L 29/417* (2006.01)

(52) U.S. Cl.
CPC .... *H01L 27/0922* (2013.01); *H01L 21/82385* (2013.01); *H01L 21/823456* (2013.01); *H01L 21/823807* (2013.01); *H01L 21/823814* (2013.01); *H01L 21/823828* (2013.01); *H01L 21/823871* (2013.01); *H01L 27/1104* (2013.01); *H01L 29/41775* (2013.01); *H01L 29/66515* (2013.01)

(58) Field of Classification Search
CPC ......... H01L 27/0922; H01L 21/823871; H01L 21/823456; H01L 29/66515; H01L 29/41775; H01L 21/82385; H01L 21/823828; H01L 27/1104; H01L 21/823814; H01L 21/823807
See application file for complete search history.

(56) References Cited

U.S. PATENT DOCUMENTS 5,112,765 A * 5/1992 Cederbaum ....... H01L 21/76895
148/DIG. 164
5,607,681 A    3/1997 Huang
(Continued)

*Primary Examiner* — Bac H Au
(74) *Attorney, Agent, or Firm* — Amerson Law Firm, PLLC

(57) ABSTRACT

One illustrative method disclosed herein includes, among other things, performing at least one etching process to expose at least a portion of an upper surface of a gate electrode of a first transistor device and at least a vertical portion of one side surface of the gate electrode and performing a material growth process to form a conductive gate-to-source/drain (GSD) contact structure that conductively couples the gate electrode of the first transistor device to a source/drain region of the first transistor device, wherein the conductive GSD contact structure comprises a non-single crystal material portion positioned on previously exposed portions of the gate electrode and a single crystal material portion positioned in the source/drain region.

20 Claims, 7 Drawing Sheets

(56) References Cited

U.S. PATENT DOCUMENTS

| | | | |
|---|---|---|---|
| 5,795,820 A * | 8/1998 | Kepler | H01L 21/76801 257/E21.576 |
| 5,940,735 A * | 8/1999 | Mehta | H01L 21/31155 438/783 |
| 5,986,328 A | 11/1999 | Liaw | |
| 5,990,524 A * | 11/1999 | En | H01L 21/76897 257/382 |
| 6,083,827 A * | 7/2000 | Lin | H01L 21/76895 257/E21.304 |
| 6,107,642 A | 8/2000 | Sundaresan | |
| 6,146,981 A | 11/2000 | Chen | |
| 6,153,457 A * | 11/2000 | Kuo | H01L 21/76897 257/E21.507 |
| 6,274,409 B1 * | 8/2001 | Choi | H01L 21/76895 257/E21.507 |
| 6,426,263 B1 * | 7/2002 | Chittipeddi | H01L 21/76895 257/E21.59 |
| 6,483,153 B1 * | 11/2002 | Hui | H01L 21/76895 257/288 |
| 7,416,973 B2 | 8/2008 | Peters et al. | |
| 7,449,711 B2 | 11/2008 | Asano et al. | |
| 7,510,960 B2 | 3/2009 | Toomey | |
| 7,678,658 B2 | 3/2010 | Yang et al. | |
| 7,678,690 B2 * | 3/2010 | Richter | H01L 21/76832 257/E21.577 |
| 8,178,931 B2 | 5/2012 | Toomey | |
| 8,338,292 B2 | 12/2012 | Tan et al. | |
| 8,823,149 B2 | 9/2014 | Jakubowski et al. | |
| 8,956,928 B2 * | 2/2015 | Jakubowski | H01L 29/66969 438/150 |
| 9,064,733 B2 | 6/2015 | Jakubowski et al. | |
| 10,096,606 B1 * | 10/2018 | Zang | H01L 29/785 |
| 2005/0051867 A1 | 3/2005 | Lee et al. | |
| 2007/0178685 A1 * | 8/2007 | Peters | H01L 21/76802 438/597 |
| 2008/0048333 A1 | 2/2008 | Seo et al. | |
| 2008/0054392 A1 | 3/2008 | Toomey | |
| 2009/0283853 A1 | 11/2009 | Huebinger | |
| 2010/0001369 A1 | 1/2010 | Chuang et al. | |
| 2010/0087038 A1 | 4/2010 | Chung et al. | |
| 2010/0207213 A1 | 8/2010 | Tan et al. | |
| 2011/0198699 A1 | 8/2011 | Hung et al. | |
| 2012/0211843 A1 | 8/2012 | Jung et al. | |

* cited by examiner

METHODS OF FORMING A GATE-TO-SOURCE/DRAIN CONTACT STRUCTURE

BACKGROUND OF THE INVENTION

1. Field of the Invention

The present disclosure generally relates to the fabrication of integrated circuits, and, more particularly, to various novel methods of forming a gate-to-source/drain (GSD) contact structure.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. CMOS (Complementary Metal Oxide Semiconductor) technology or products refers to integrated circuit products that are manufactured using both NMOS and PMOS transistor devices. Irrespective of the physical configuration of the transistor device, each transistor device comprises laterally spaced apart drain and source regions that are formed in a semiconductor substrate, a gate electrode structure positioned above the substrate and between the source/drain regions, and a gate insulation layer positioned between the gate electrode and the substrate. Upon application of an appropriate control voltage to the gate electrode, a conductive channel region forms between the source region and the drain region and current flows from the source region to the drain region.

These transistor devices (and other semiconductor devices, e.g., resistors, capacitors) are arranged in various circuits that are part of various functional components of the IC product, e.g., a microprocessor (logic area), a memory array (memory area), an ASIC, etc. Like all electronic devices, semiconductor devices in an IC product need to be electrically connected through wiring so that they may operate as designed. In an IC product, such wiring is done through multiple metallization layers formed above a semiconductor substrate.

A plurality of conductive contacts is formed as part of establishing electrical connection to a transistor. Typically, a separate source/drain contact structure is formed for each of the source/drain regions so as to provide an independent electrical connection for each of the source/drain regions. A separate gate contact structure is formed so as to establish an independent electrical connection to the gate structure of the transistor. The source/drain contact structures may be in the form of discrete contact elements, i.e., one or more individual contact plugs having a generally square-like shape or cylindrical shape when viewed from above, that are formed in an interlayer dielectric material. The gate contact structure is typically not positioned above the active region defined in the substrate, but it may be in some advanced architectures.

However, in some applications, such as in SRAM circuits, it is necessary to form a conductive contact or conductive strap between the gate electrode of a transistor and one of the source/drain regions of that transistor, i.e., a gate-to-source/drain (GSD) contact structure. The GSD contact structure creates an electrical short between the gate electrode and one of the source/drain regions. In many applications, the GSD contact structure has a generally rectangular structure when viewed from above, and it generally has a larger lateral width than that of a traditional source/drain contact structure that only contacts a single source/drain region. In many modern transistors, an epitaxial semiconductor material is formed in the source/drain regions of the transistor devices above the surface of the substrate. Unfortunately, as device dimensions have continued to shrink, problems have arisen as it relates to forming a GSD contact structure that contacts the gate electrode and the epi semiconductor material in the source/drain region. In some applications, there may be a gap between the GSD contact structure and the epi semiconductor material, which leads to device failure and reduced product yields.

The present disclosure is directed to various novel methods of forming a gate-to-source/drain (GSD) contact structure that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to novel methods of forming a gate-to-source/drain (GSD) contact structure. One illustrative method disclosed herein includes, among other things, performing at least one etching process to expose at least a portion of an upper surface of a gate electrode of a first transistor device and at least a vertical portion of one side surface of the gate electrode and performing a material growth process to form a conductive gate-to-source/drain (GSD) contact structure that conductively couples the gate electrode of the first transistor device to a source/drain region of the first transistor device, wherein the conductive GSD contact structure comprises a non-single crystal material portion positioned on previously exposed portions of the gate electrode and a single crystal material portion positioned in the source/drain region.

BRIEF DESCRIPTION OF THE DRAWINGS

The disclosure may be understood by reference to the following description taken in conjunction with the accompanying drawings, in which like reference numerals identify like elements, and in which.

Figure 1:
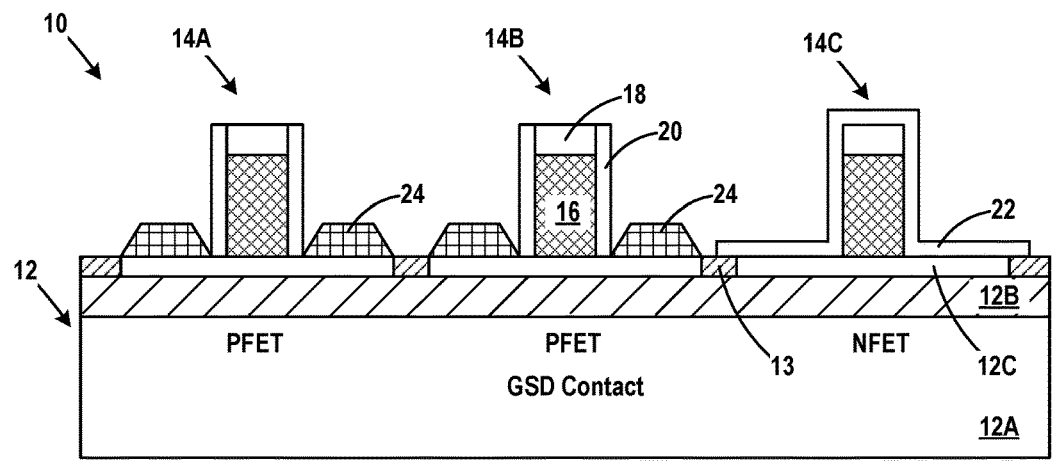
FIG. 1-16 depict various novel methods disclosed herein for forming a gate-to-source/drain (GSD) contact structure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to novel methods of forming a gate-to-source/drain (GSD) contact structure. As will be readily apparent to those skilled in the art upon a complete reading of the present application, the present method is applicable to a variety of products, including, but not limited to, logic products, memory products, etc. For example, the method disclosed herein may be employed in any type of application in any type of IC product, circuit or device wherein a conductive contact structure is formed between the gate structure of a transistor device and one of the source/drain regions of the device, i.e., a GSD contact structure, such as, for example, in an SRAM device. With reference to the attached figures, various illustrative embodiments of the methods and devices disclosed herein will now be described in more detail.

An illustrative integrated circuit (IC) product 10 disclosed herein will be formed in and above a semiconductor substrate 12. The substrate 12 may have a variety of configurations, such as a bulk silicon configuration or the depicted silicon-on-insulator (SOI) configuration. Such an SOI substrate 12 includes a bulk semiconductor layer 12A, a buried insulation layer 12B and an active semiconductor layer 12C, wherein a plurality of transistor devices 14A-C (collectively referred to using the reference numeral 14) are formed in and above the active layer 12C. The active layer 12C and/or the bulk semiconductor layer 12A may be made of silicon or they may be made of semiconductor materials other than silicon, and they both do not have to be made of the same semiconductor material. Thus, the terms "substrate" or "semiconductor substrate" should be understood to cover all semiconducting materials and all forms of such materials.

The various components and structures of the device disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application.

FIG. 1 depicts the product 10 after isolation regions 13 (e.g., silicon nitride) were formed in the active layer 12C. The isolation regions 13 were formed by etching openings in the active layer 12C and thereafter filling the openings with insulating material.

With continuing reference to FIG. 1, and as noted above, a plurality of transistor devices 14 will be formed above the substrate 12. In the example depicted herein, the transistors 14A and 14B are PFET devices, while the transistor 14C is an NFET device. Of course, in other applications, the transistors 14A and 14B may be NFET devices while the transistor device 14C is a PFET device. In the example depicted herein, a GSD contact structure will be formed on the transistor 14B. It should also be noted that the presently disclosed inventions are not limited to IC products 10 that are formed using CMOS technology, i.e., all of the transistors 14 may be the same device type (N or P). In the example depicted herein, the transistor devices 14 are planar transistor devices. However, after a complete reading of the present application, those skilled in the art will appreciate that the methods disclosed herein may be employed with other types of transistor devices, such as FinFET devices. Thus, the presently disclosed inventions should not be considered to be limited to any IC products that include any particular form of transistor devices. Additionally, various doped regions, e.g., halo implant regions, doped source/drain regions, well regions and the like, and certain material layers, e.g., etch stop contact layers, are not depicted in the attached drawings.

The transistors 14 generally comprise a gate electrode 16, a gate cap 18 and a sidewall spacer 20. A gate insulating layer (not shown), e.g., silicon dioxide, is normally formed between the gate electrode 16 and the substrate 12. The gate electrode 16 may be comprised of a variety of materials, e.g., amorphous silicon, polysilicon, etc. In terms of processing steps, the material for the gate insulation layer (not shown) may be formed by performing an oxidation process so as to oxidize the exposed portions of the active layer 12C. At that point, the material for the gate electrode 16, e.g., amorphous silicon, polysilicon, etc., was blanket-deposited across the substrate 12 and its upper surface was subjected to a chemical mechanical polishing (CMP) process to planarize the upper surface of the deposited layer of material. Thereafter, the material for the gate cap 18, e.g., silicon nitride, was blanket-deposited across the substrate 12 above the layer of material for the gate electrode 16. At that point, a patterned etch mask layer (not shown) was formed above the layer of gate cap material. Then, an etching process was performed though the patterned etch mask so as to pattern the layer of gate cap material, thereby resulting in the gate caps 18 depicted in FIG. 1. Then, the patterned etch mask was removed and an etching process was performed through the gate caps 18 (which function as an etch mask) to remove exposed portions of the gate electrode material layer so as to result in the patterned gate electrode structures 16 for the transistors 14.

With continuing reference to FIG. 1, the spacers 20 for the transistors 14A-14B were formed by performing the following process operations. First, a conformal layer of spacer material 22 (e.g., silicon nitride, SiNC, SiN, SiCO and SiNOC) was formed on the product 10 by performing a conformal deposition process, e.g., a conformal ALD deposition process. Then, a patterned etch mask layer (e.g., photoresist) (not shown) was formed on the product 10 so as to cover the layer of spacer material 22 on the transistor 14C but expose the layer of spacer material 22 on the transistors 14A-14B for further processing. Next, an anisotropic etching process was performed through the patterned etch mask layer to remove horizontally positioned portions of the layer of spacer material 22 so as to form the spacers 20 on the transistors 14A-14B. Next, with the layer of spacer material 22 in position on the transistor 14C, a source/drain epitaxial growth process was performed to form single crystal epi semiconductor material 24 on the source/drain regions of the transistors 14A-14B. The epi semiconductor material 24 may be any type of semiconductor material, e.g., silicon, SiGe, SiC, etc., and it may be formed to any desired thickness. The epi semiconductor material 24 may be doped in situ with an appropriate dopant for the transistor device under construction. In the example depicted herein, where the transistors 14A-14B are PFET transistors, the epi material 24 may be doped with a P-type dopant.

Figure 2:
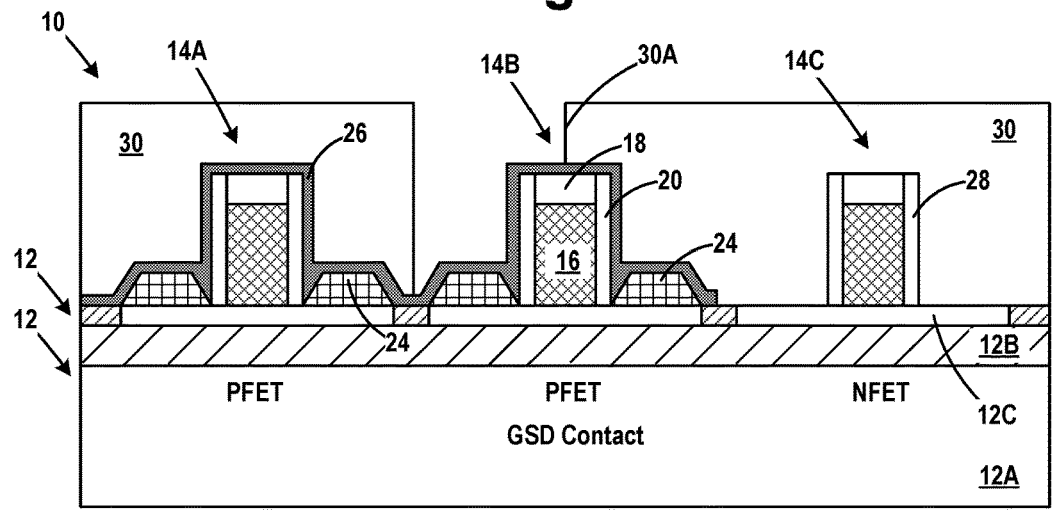
Figure 3:
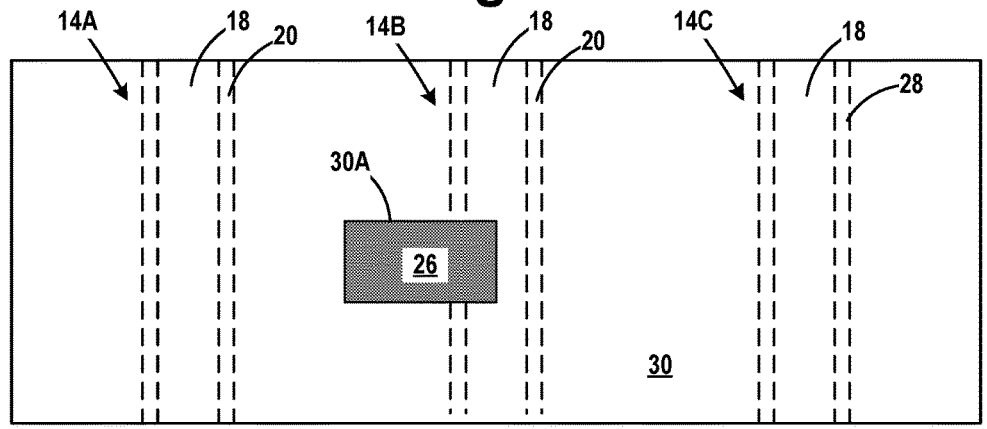

FIGS. 2 (cross-sectional view) and 3 (plan view) depict the product 10 after several process operations were performed. First, a conformal layer of protective material 26 (e.g., silicon nitride, SiNC, SiN, SiCO and SiNOC) was formed across all three transistors 14. The conformal layer of protective material 26 should be made of a material that may be selectively etched relative to the material of the layer of spacer material 22. At that point, another patterned etch mask layer (not shown) was formed on the product so as cover the transistors 14A-14B while leaving the transistor 14C exposed for further processing. Thereafter, an etching process was performed to remove the layer of protective material 26 from the transistor 14C so as to expose the remaining portions of the layer of spacer material 22 on the transistor 14C. At that point, another anisotropic etching process was performed through the patterned etch mask layer (not shown) to remove horizontally positioned portions of the layer of spacer material 22 and form the spacer 28 on the transistor 14C. Then, the patterned etch mask layer (not shown) was removed. With continuing reference to FIGS. 2 and 3, another patterned etch mask layer 30 was formed on the product 10. In one illustrative embodiment, the patterned etch mask 30 has a generally rectangular shaped opening 30A (when viewed from above—see FIG. 3) that exposes a portion (into and out of the plane of the drawing page) of the transistor 14B, i.e., the transistor where the GSD contact structure will be formed. More specifically, an axial length of the transistor 14B (in the gate width direction of the transistor 14B) is exposed for a distance that corresponds to the size of the opening 30A in the patterned etch mask 30.

Figure 4:
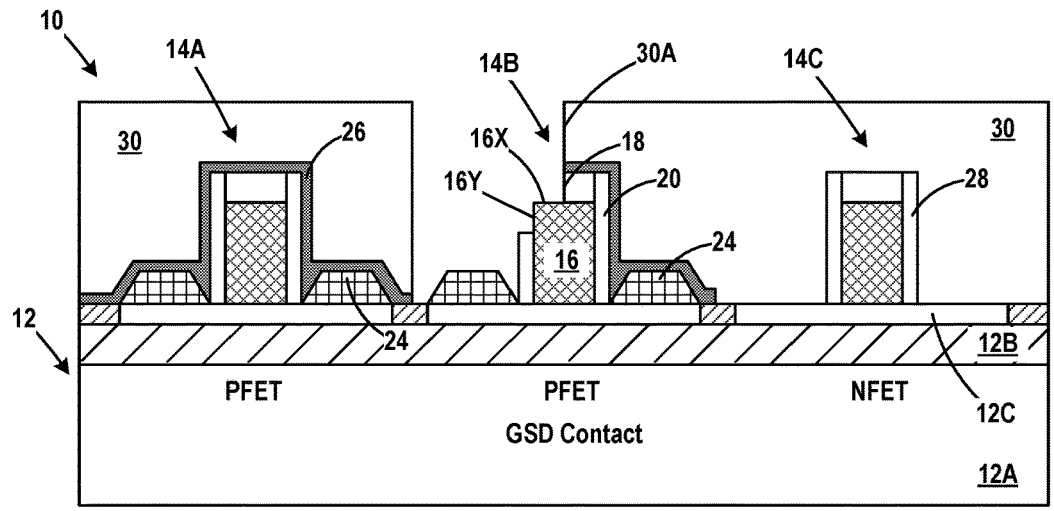

FIG. 4 depicts the product 10 after one or more etching processes were performed through the patterned etch mask layer 30 to remove exposed portions of the layer of protective material 26, the gate cap 18 and the sidewall spacer 20 on one side of the gate electrode 16 of the transistor 14B positioned under the opening 30A. As depicted, these process operations expose at least a portion of the axial length (that extends into and out of the plane of the drawing page) of the upper surface 16X of the gate electrode 16 and an axial length portion and vertical portion of one side surface 16Y of the gate electrode 16. The exposed portions of the upper surface 16X and the sidewall 16Y extend into and out of the plane of the drawing page, i.e., in the gate width direction of the transistor 14B, for a distance corresponding to the size of the opening 30A in the patterned etch mask 30. These process operations also expose a portion of the epi material 24 on one of the source/drain regions of the transistor 14B.

Figure 5:
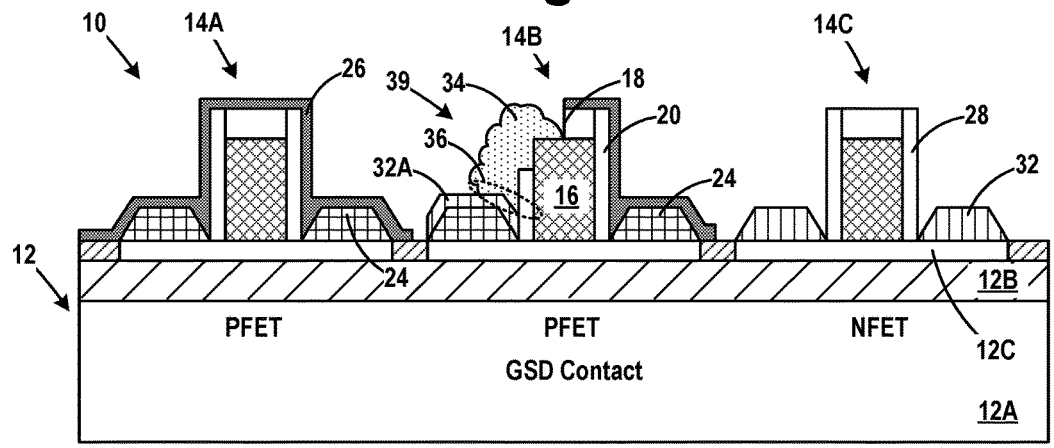

FIG. 5 depicts the product 10 after several process operations were performed. First, the patterned etch mask layer 30 (see FIG. 4) was removed. Then, a source/drain material growth process was performed to form a single crystal epi semiconductor material 32 on the source/drain regions of the transistor 14C. The epi semiconductor material 32 may be any type of semiconductor material, e.g., silicon, SiGe, SiC, etc., and it may be formed to any desired thickness. The material formed during this material growth process may be doped in situ with an appropriate dopant for the transistor device under construction. In the example depicted herein, where the transistor 14C is an NFET transistor, the material formed during this growth process may be doped with an N-type dopant. Also note that, during this second source/drain material growth process, a portion or layer 32A of single crystal semiconductor material also forms on the exposed portion of the epi material 24 in the exposed portion of the source/drain region of the transistor 14B. Also, during this source/drain material growth process, a non-single crystal material 34 (e.g., polycrystalline or amorphous material), such as, for example, amorphous silicon or polysilicon, forms on the exposed portions of the gate electrode 16 of the transistor 14B. As depicted, the non-single crystal material 34 effectively merges with the single crystal layer of epi material 32A along an interface (within the dashed line 36) so as to form a conductive GSD contact structure 39 that electrically couples the gate electrode of the transistor 14B with one of the source/drain regions of the transistor 14B. Thus, this second source/drain material growth process may be referred to as a GSD contact material growth process. In this embodiment, the conductive GSD contact structure 39 comprises non-single crystal material 34 and the layer 32A of single crystal epi semiconductor material. Please note that, in a real-world device, the interface between the non-single crystal material 34 and the layer of single crystal epi material 32A will likely not be as linear as simplistically depicted in the drawings.

Figure 6:
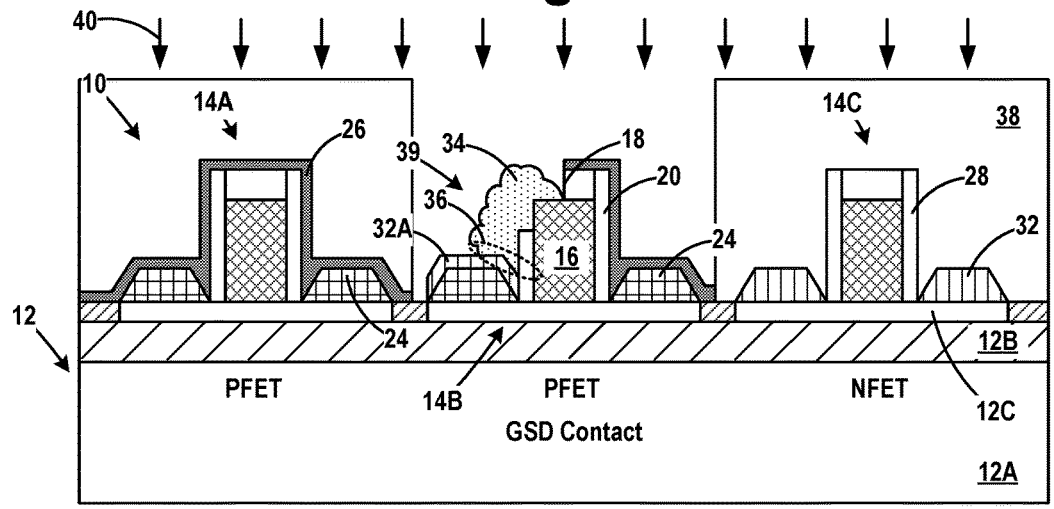

FIG. 6 presents an embodiment wherein, if desired, an ion implant process 40 may be performed on the GSD contact structure 39 through another patterned mask layer 38. The ion implant process 40 may be performed to implant ions of a type opposite the dopant present in the layer 32A of the single crystal epi material formed on the transistor 14B. Thus, in the case where the layer 32A of the single crystal epi material contains an N-type dopant, the ion implant process 40 may be performed with a P-type dopant. The ion implant process 40 is performed so as to effectively overwhelm the dopant atoms present in the layer 32A of the single crystal epi material. The dopant dose and implant energy used during the ion implant process 40 may vary depending upon the particular application. However, it should be noted that the ion implant process 40 may not need to be performed in at least some applications.

Figure 7:
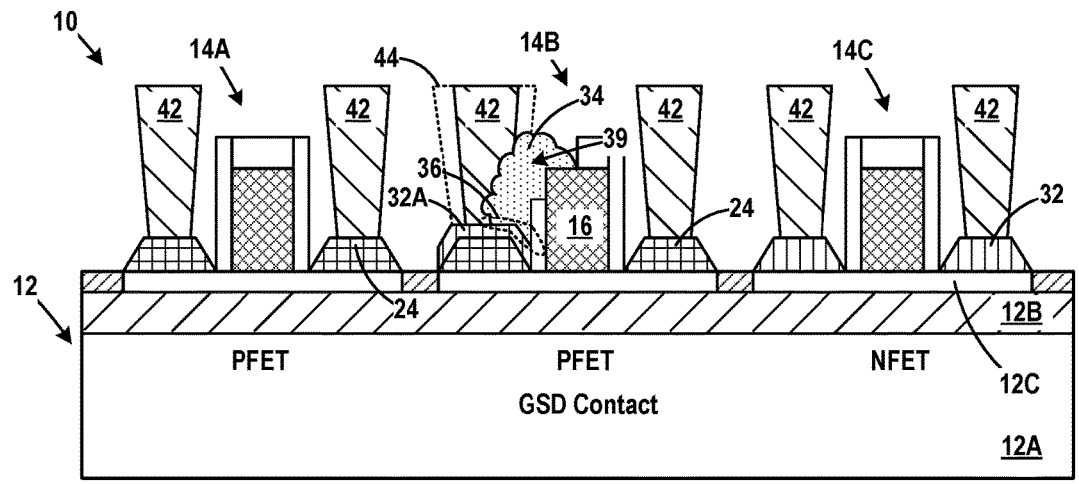

FIG. 7 depicts the product 10 after several process operations were performed. First, the patterned etch mask layer 38 (if formed at all—see FIG. 6) was removed. Then, a layer of metal silicide (not shown) was formed on the materials 24 and 32 as well as on the GSD contact structure 39 to reduce the contact resistance of these structures. Then, one or more layers of insulating material (not shown) and various simplistically depicted conductive contact structures 42 were formed so as to establish electrical connections to the source/drain regions of the transistors 14. With respect to the transistor 14B, one of the conductive contact structures 42 is conductively coupled to the GSD contact structure 39. One benefit of the methods disclosed herein is that, due to the manner in which the GSD contact structure 39 is formed, the conductive contact structure 42 that is coupled to the GSD contact structure 39 may have a smaller lateral width as compared to a traditional GSD contact, the outline of which is simplistically depicted by the dashed line 44, thereby permitting higher packing densities. Such traditional GSD contacts were formed "extra wide" in an attempt to insure that electrical contact was, in fact, established between the gate electrode and the source/drain region. As noted above, the conductive contact structures 42 are intended to be representative in nature as they may take a variety of forms and they may be made from a variety of conductive materials, e.g., tungsten, trench silicide materials, etc. In some cases, the conductive contact structures 42 may also include a traditional source/drain contact structure (not separately shown). Although not depicted in the cross-sectional view shown in FIG. 7, conductive gate contact structures will also be made to the gate electrodes 16 of the transistors 14A and 14C.

Figure 8:
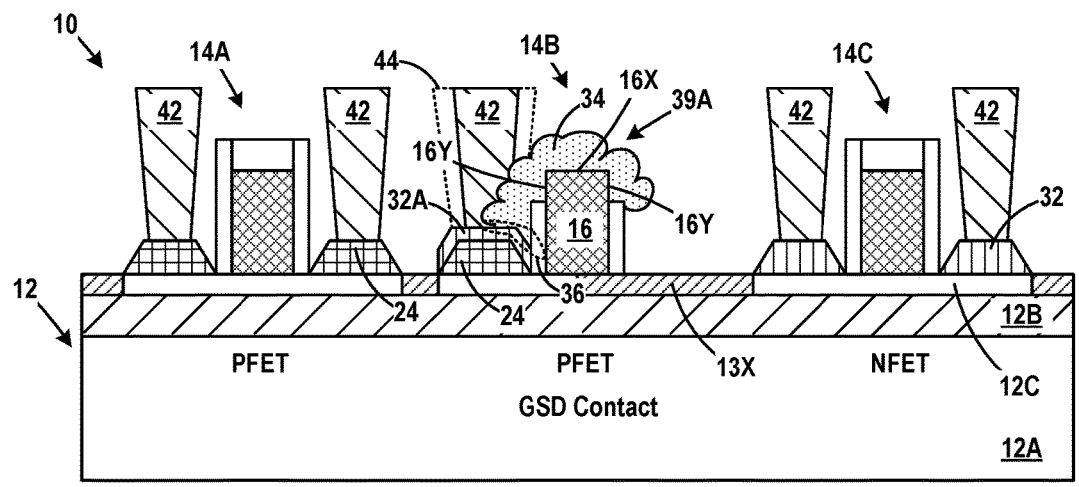

FIG. 8 depicts an embodiment of an IC product wherein the transistor 14B may be partially positioned above an isolation region 13X formed in the substrate 12. In such an embodiment, the epi source/drain material 24 will only be formed on one side of the gate electrode 16 of the transistor 14B. Such an arrangement permits the formation of a relatively larger GSD contact structure 39A (as compared to the size of the GSD contact structure 39), as substantially the entire upper surface 16X of the gate electrode 16 (for at least a certain axial length) and vertical portions of both side surfaces 16Y (for at least a certain axial length) may be exposed prior to forming the materials 32A, 34.

Figure 9:
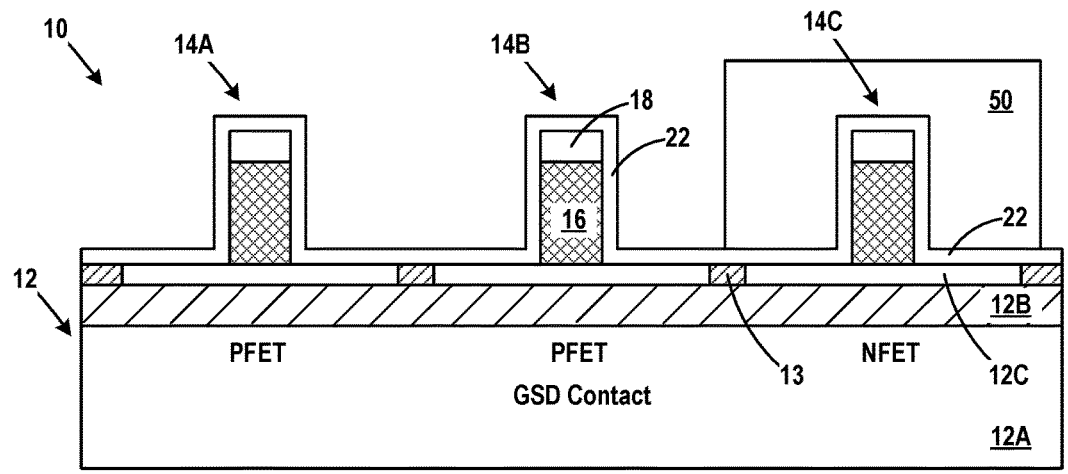

FIGS. 9-16 depict another illustrative process flow disclosed herein for formation of a GSD contact structure 39 on the transistor 14B. As shown in FIG. 9, after the formation of the gate electrodes 16 and gate caps 18 for all of the transistors 14, the above-described conformal layer of spacer material 22 was formed on all three transistors 14. Then, a patterned etch mask layer 50 was formed on the product 10 so as to cover the layer of spacer material 22 on the transistor 14C while leaving the layer of spacer material 22 on the transistors 14A-14B exposed for further processing.

Figure 10:
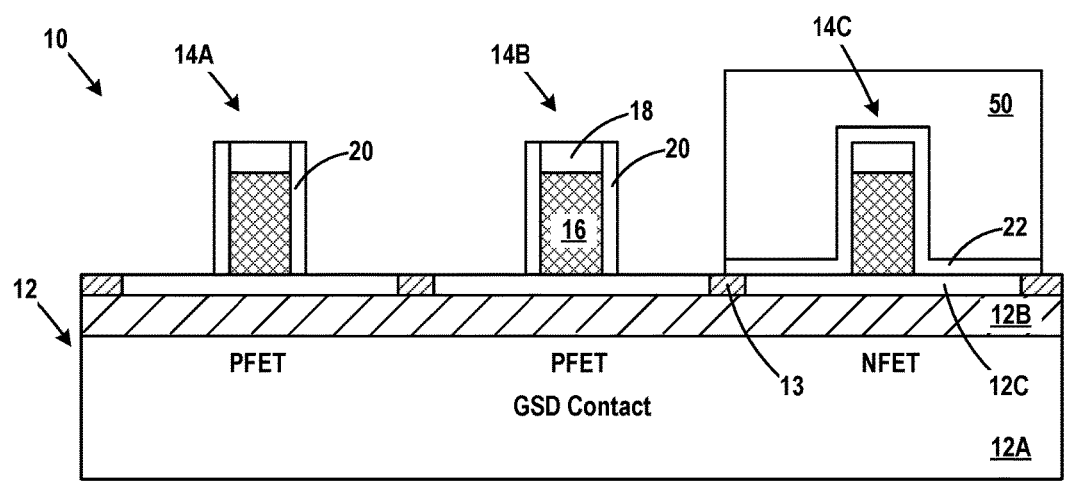

FIG. 10 depicts the product 10 after an anisotropic etching process was performed through the patterned etch mask layer 50 to remove horizontally positioned portions of the layer of spacer material 22 so as to form the spacers 20 on the transistors 14A-14B.

Figure 11:
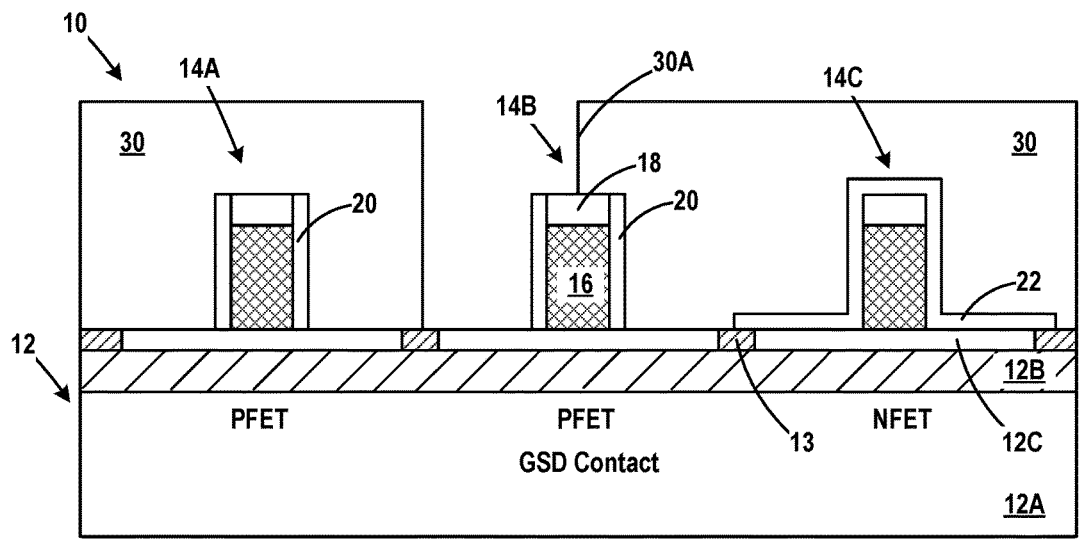

FIG. 11 depicts the product 10 after several process operations were performed. First, the patterned etch mask 50 was removed. Thereafter, the above-described patterned etch mask 30 (with the opening 30A formed therein) was formed on the product 10. The opening 30A exposes a portion of the transistor 14B, i.e., the transistor where the GSD contact structure 39 will be formed. In one illustrative embodiment, the opening 30A may extend for approximately the entire axial length of the source/drain region (in the gate width direction of the transistor device), i.e., into and out of the plane of the drawing shown in FIG. 11.

Figure 12:
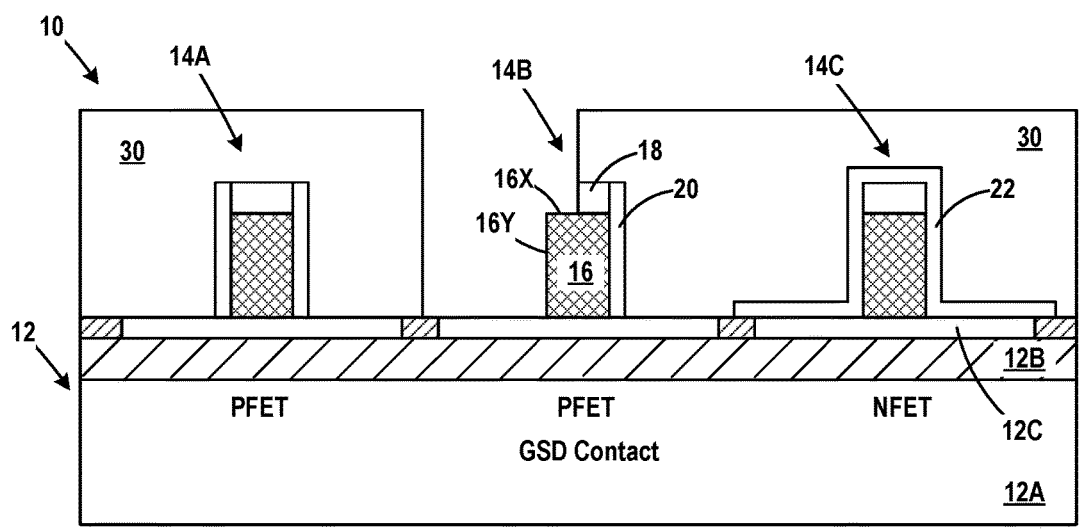

FIG. 12 depicts the product 10 after one or more etching processes were performed through the patterned etch mask layer 30 to remove exposed portions of the gate cap 18 (for a certain axial length) and substantially the entirety of a vertical portion of the sidewall spacer 20 (for a certain axial length) on one side of the gate electrode 16 of the transistor 14B. As depicted, these process operations expose a portion of the upper surface 16X (for a certain axial length) of the gate electrode 16 and substantially the entirety of one side surface 16Y of the gate electrode 16 (for a certain axial length) that is positioned below the opening 30A (i.e., for a distance in the gate width direction of the transistor 14B).

Figure 13:
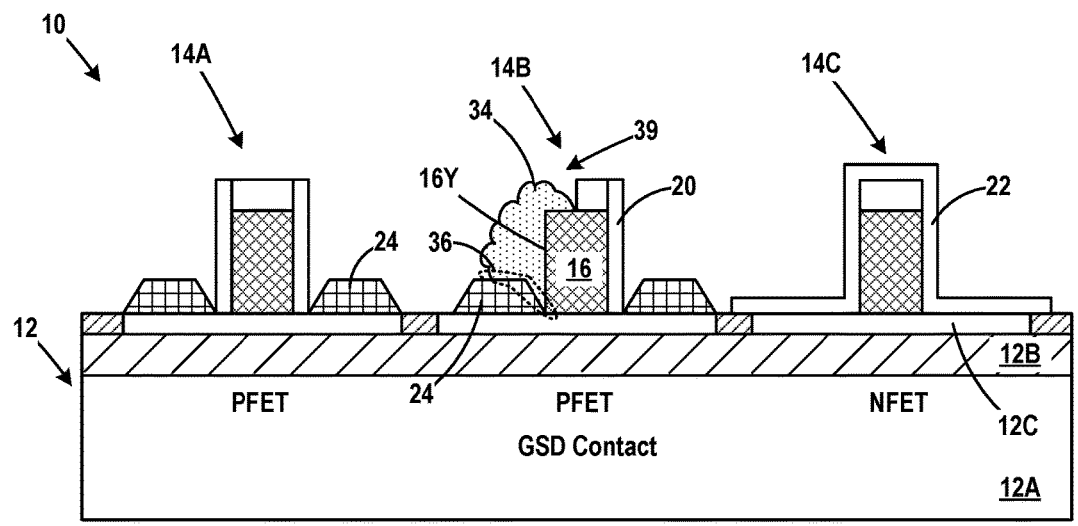

As shown in FIG. 13, with the layer of spacer material 22 in position on the transistor 14C, a source/drain material growth process was performed to form the above-described single crystal epi semiconductor material 24 on the semiconductor substrate in the source/drain regions of the transistors 14A-14B. Also, during this source/drain material growth process, the above-described non-single crystal material 34, such as, for example, amorphous silicon or polysilicon, forms on the exposed portions of the gate electrode 16 of the transistor 14B. As depicted, the non-single crystal material 34 effectively merges with the single crystal epi material 24 along an interface (within the dashed line 36) so as to form a conductive GSD contact structure 39 that electrically couples the gate electrode of the transistor 14B with one of the source/drain regions of the transistor 14B. Note that the non-single crystal material 34 covers substantially the entirety of the exposed sidewall 16Y of the gate electrode 16. Thus, in this embodiment, this source/drain material growth process performed on the PFET devices may be referred to as a GSD contact material growth process. In this embodiment, the conductive GSD contact structure 39 comprises non-single crystal material 34 and the single crystal epi material 24 that was formed on the substrate 12 adjacent the gate electrode 16. Also note that, in this embodiment, the layer 32A of single crystal material for the transistor 14C may not be formed on the single crystal epi material 24 for the transistor 14B. As a result, the ion implantation process 40 described above (see FIG. 6) need not be performed as there is no counter-doped epi material formed on the epi material 24 for the transistor 14B.

Figure 14:
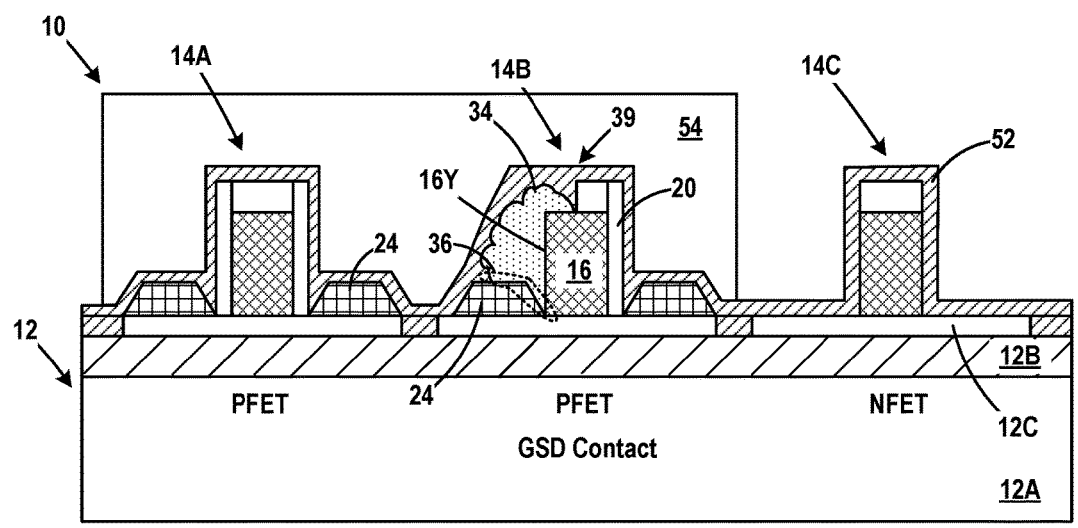

FIG. 14 depicts the product 10 after several process operations were performed. First, the remaining portions of the layer of spacer material 22 on the transistor 14C were removed. Then, a conformal layer of spacer material 52 (e.g., silicon nitride, SiNC, SiN, SiCO and SiNOC) was formed across all three transistors 14 and the GSD contact structure 39. At that point, another patterned etch mask layer 54 was formed on the product so as to cover the transistors 14A-14B while leaving the transistor 14C exposed for further processing.

Figure 15:
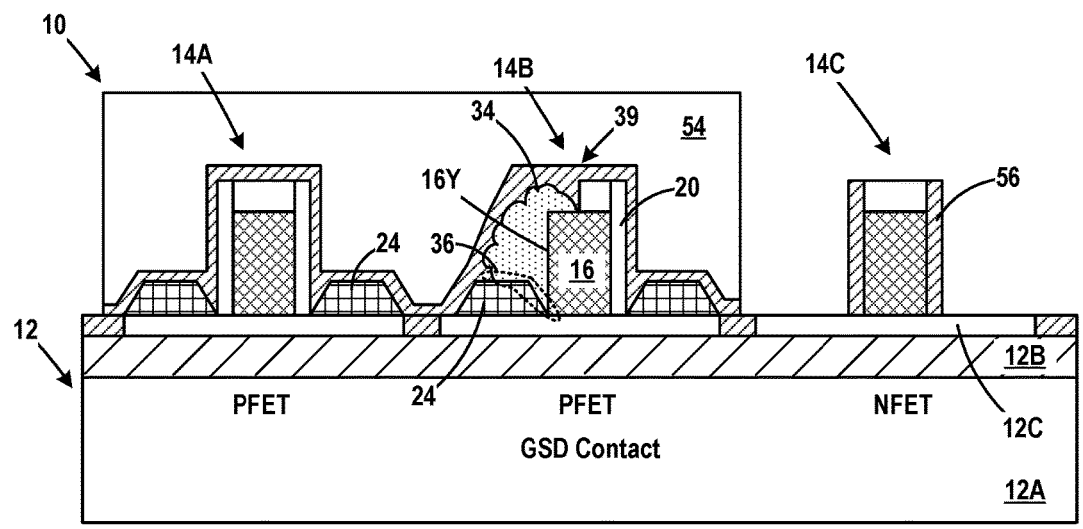

FIG. 15 depicts the product after an anisotropic etching process was performed through the patterned etch mask layer 54 to remove horizontally positioned portions of the layer of spacer material 52 and form the spacer 56 on the transistor 14C.

Figure 16:
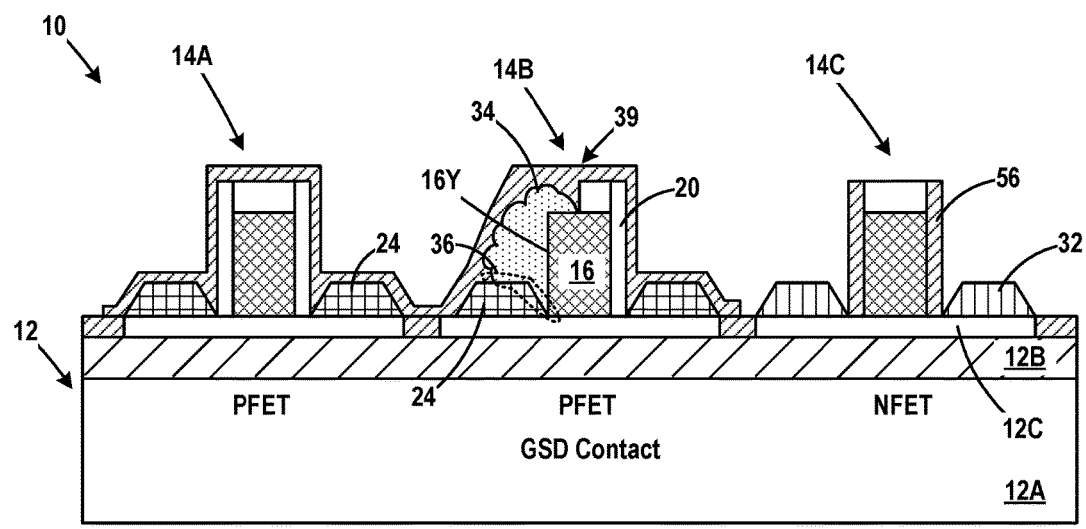

FIG. 16 depicts the product 10 after several process operations were performed. First, the patterned etch mask layer 54 was removed. Then, an epitaxial growth process was performed to form the above-described single crystal epi semiconductor material 32 on the source/drain regions of the transistor 14C. At this point in the process flow, the above-described layer of metal silicide (not shown) was formed on the epi materials 24 and 32 as well as on the GSD contact structure 39 to reduce contact resistance. Then, the above-described simplistically depicted conductive contact structures 42 were formed so as to establish electrical connections to the source/drain regions of the transistors 14, wherein one of the conductive contact structures 42 is conductively coupled to the GSD contact structure 39.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a conductive gate-to-source/drain (GSD) contact structure for a first transistor device, the first transistor device comprising a gate electrode, a gate cap covering an upper surface of said gate electrode, and a sidewall spacer covering side surfaces of said gate electrode, the method comprising:
performing at least one etching process to remove at least a portion of said gate cap so as to expose at least a portion of said upper surface of said gate electrode of said first transistor device and to remove at least a portion of said sidewall spacer so as to expose at least a vertical portion of one of said side surfaces of said gate electrode; and
performing a GSD contact material growth process to form said conductive GSD contact structure that conductively couples said gate electrode of said first transistor device to a source/drain region of said first transistor device, wherein said conductive GSD contact structure comprises a non-single crystal material portion positioned on previously exposed portions of said gate electrode and a single crystal material portion positioned in said source/drain region.

2. The method of claim 1, wherein said first transistor device is a planar transistor device, wherein said gate electrode comprises one of polysilicon or amorphous silicon and wherein said non-single crystal material is one of a polycrystalline or amorphous material.

3. The method of claim 1, wherein, prior to performing said GSD contact material growth process, the method further comprises performing a source/drain epitaxial growth process to form a first single crystal epi semiconductor material in said source/drain region of said first transistor device.

4. The method of claim 3, wherein performing said GSD contact material growth process also forms a second single crystal epi semiconductor material in a source/drain region of a second transistor device and a layer of said second single crystal epi semiconductor material on said first single crystal epi semiconductor material on said first transistor device, wherein said first and second transistor devices are opposite type devices.

5. The method of claim 3, further comprising performing an ion implantation process on said conductive GSD contact structure to implant dopant ions into at least said conductive GSD contact structure.

6. The method of claim 1, wherein performing said at least one etching process comprises performing said at least one etching process to expose an entirety of said upper surface of said gate electrode of said first transistor device and at least a vertical portion of first and second side surfaces of said gate electrode.

7. The method of claim 1, further comprising:
forming a metal silicide on at least said conductive GSD contact structure; and
forming a conductive source/drain contact structure that is conductively coupled to said conductive GSD contact structure.

8. The method of claim 1, wherein performing said at least one etching process comprises performing said at least one etching process to expose at least a portion of said upper surface of said gate electrode of said first transistor device and substantially an entirety of at least a portion of one of said side surfaces of said gate electrode.

9. The method of claim 1, wherein performing said GSD contact material growth process forms said single crystal material portion of said conductive GSD contact structure on a semiconductor substrate located adjacent said gate electrode of said first transistor device.

10. The method of claim 1, wherein, after performing said GSD contact material growth process, the method further comprises performing an epitaxial growth process to form a second single crystal epi semiconductor material in a source/drain region of a second transistor device, wherein said first and second transistor devices are opposite type devices.

11. A method of forming a conductive gate-to-source/drain (GSD) contact structure for a first transistor device, the method comprising:
performing a source/drain epitaxial growth process to form a first single crystal epi semiconductor material in a source/drain region of said first transistor device;
performing at least one etching process to expose at least a portion of an upper surface of a gate electrode of said first transistor device, at least a vertical portion of one side surface of said gate electrode of said first transistor device and at least a portion of said first single crystal epi semiconductor material; and
performing a GSD contact material growth process to form a second single crystal epi semiconductor material in a source/drain region of a second transistor device and a layer of said second single crystal epi semiconductor on said first single crystal epi semiconductor material on said first transistor device, wherein said first and second transistor devices are opposite type devices, and wherein said conductive GSD contact structure comprises a non-single crystal material portion positioned on previously exposed portions of said gate electrode of said first transistor device and said layer of said second single crystal epi semiconductor positioned on said first single crystal epi semiconductor.

12. The method of claim 11, further comprising performing an ion implantation process on said conductive GSD contact structure to implant dopant ions into at least said conductive GSD contact structure.

13. The method of claim 11, wherein said first transistor device is a PFET device and said second transistor device is an NFET device.

14. The method of claim 11, wherein, after performing said source/drain epitaxial growth process to form said first single crystal epi semiconductor material, the method further comprises forming a conformal protective layer over said first transistor device and said first single crystal epi semiconductor material.

15. The method of claim 14, wherein performing said at least one etching process removes at least a portion of said conformal protective layer.

16. The method of claim 11, wherein performing said at least one etching process comprises performing said at least one etching process to expose an entirety of said upper surface of said gate electrode of said first transistor device and at least a vertical portion of first and second side surfaces of said gate electrode.

17. A method of forming a conductive gate-to-source/drain (GSD) contact structure for a first transistor device, the first transistor device comprising a gate electrode, a gate cap covering an upper surface of said gate electrode, and a sidewall spacer covering side surfaces of said gate electrode, the method comprising:
performing at least one etching process to remove at least a portion of said gate cap so as to expose at least a portion of said upper surface of said gate electrode of said first transistor device, to remove at least a portion of said sidewall spacer so as to expose substantially an entirety of at least an axial portion of one of said side surfaces of said gate electrode, and to expose a portion of a semiconductor substrate located adjacent said gate electrode of said first transistor device; and
performing a GSD contact material growth process to form said conductive GSD contact structure that conductively couples said gate electrode of said first transistor device to a source/drain region of said first transistor device, wherein said conductive GSD contact structure comprises a non-single crystal material portion positioned on previously exposed portions of said gate electrode and a single crystal material portion positioned in said source/drain region on said semiconductor substrate located adjacent said gate electrode of said first transistor device.

18. The method of claim 17, wherein, after performing said GSD contact material growth process, the method further comprises performing a second epitaxial growth process to form a second single crystal epi semiconductor material in a source/drain region of a second transistor device, wherein said first and second transistor devices are opposite type devices.

19. The method of claim 17, wherein, after performing said GSD contact material growth process, the method further comprises forming a second sidewall spacer adjacent a gate electrode of a second transistor device, wherein said first and second transistor devices are opposite type devices.

20. The method of claim 19, further comprising performing a second epitaxial growth process to form a second single crystal epi semiconductor material in a source/drain region of said second transistor device.

* * * * *